United States Patent [19]

Marlowe et al.

[11] 4,160,273

[45] Jul. 3, 1979

[54] DIGITAL MEMORY ADDRESSING SYSTEM

[75] Inventors: Frank J. Marlowe, Kingston; Robert H. Dawson, Princeton, both of N.J.

[73] Assignee: RCA Corporation, New York, N.Y.

[21] Appl. No.: 852,086

[22] Filed: Nov. 16, 1977

[51] Int. Cl.² .............................................. G11C 8/00
[52] U.S. Cl. .................................... 364/900; 340/750
[58] Field of Search ............ 365/45; 324/78 D, 99 D; 364/200 MS File, 900 MS File

[56] References Cited

U.S. PATENT DOCUMENTS

| 3,662,347 | 5/1972 | Fox | 364/900 |
| 4,056,820 | 11/1977 | Hofer | 340/347 AD X |

Primary Examiner—Gareth D. Shaw
Assistant Examiner—Thomas M. Heckler

Attorney, Agent, or Firm—Eugene M. Whitacre; George E. Haas; Vincent J. Coughlin, Jr.

[57] ABSTRACT

A digital memory may be addressed with an analog signal utilizing a circuit comprising a digital to analog converter. A comparator compares the output of the digital to analog converter to the analog address signal. The output of the comparator is coupled to means for incrementing and decrementing a digital number in response to that output. The digital number incrementing and decrementing means has an output which is coupled to the addressing input of the digital memory. Switch means alternately connects the input of the digital to analog converter to either the output of the random access memory or the output of the means for changing the digital number.

9 Claims, 3 Drawing Figures

DIGITAL MEMORY ADDRESSING SYSTEM

BACKGROUND OF THE INVENTION

The present invention relates to digital-to-analog converters and specifically to such converters for use in addressing a digital memory.

Recently, several image display devices have been proposed utilizing a number of electron beams which scan different sections of the image display screen. One such device is disclosed in U.S. Pat. No. 4,028,582 entitled "Guided Beam Flat Display Device". In these devices, brightness variations may exist from one portion of the screen to another due to non-uniformity in the beam intensities for each of the screen sections. To solve this non-uniformity problem, a feedback system has been proposed wherein the electron beam intensity for each portion of the screen in periodically sensed and equalized to a given norm. U.S. Patent Application Ser. No. 749,178, now U.S. Pat. No. 4,126,814 filed on Dec. 9, 1976 by F. J. Marlowe and entitled "Electron Gun Control System," presents a system for providing this electron beam sensing and feedback control. This beam equalizing circuit has a digital random access memory in which is stored data representative of a mapping of the "grid voltage" vs. "beam current characteristics" of the particular gun. A previously digitized video signal addresses various storage locations in the memory containing the particular mapping data to yield the desired brightness level. The digital mapping data is converted to analog data and is used to bias the electron gun.

In these display devices, each of the electron beams simultaneously scan its portion of the display device screen. Therefore, the incoming serial video signal must be processed to provide a parallel feed to each of the simultaneously scanning beams. A converter for accomplishing this scanning is disclosed in U.S. Patent Application Ser. No. 740,770, now U.S. Pat. No. 4,080,630 filed on Nov. 10, 1976 by F. J. Marlowe and entitled "Line Scan Converter for an Image Display Device". This line scan converter as well as the gun control system use a digitized video signal. A well known method for digitizing an analog signal is the successive approximation technique. One version of this type of analog to digital (A/D) converter is described in *Electronic Design*, Volume 25, pages 55-57, Dec. 5, 1968.

SUMMARY OF THE INVENTION

A system for addressing a digital memory with an incoming analog signal utilizes a digital-to-analog converter connected to the output of the memory. A comparator has inputs of both the output of the digital-to-analog converter and the incoming analog signal. Means for changing a digital number in response to the output of the comparator has an output coupled to the addressing input of the digital memory. A switch means alternately connects the input of the digital-to-analog converter to the output of either the memory or the means for changing the digital number.

DETAILED DESCRIPTION OF THE PREFERRED EMBODIMENT

Figure 1:
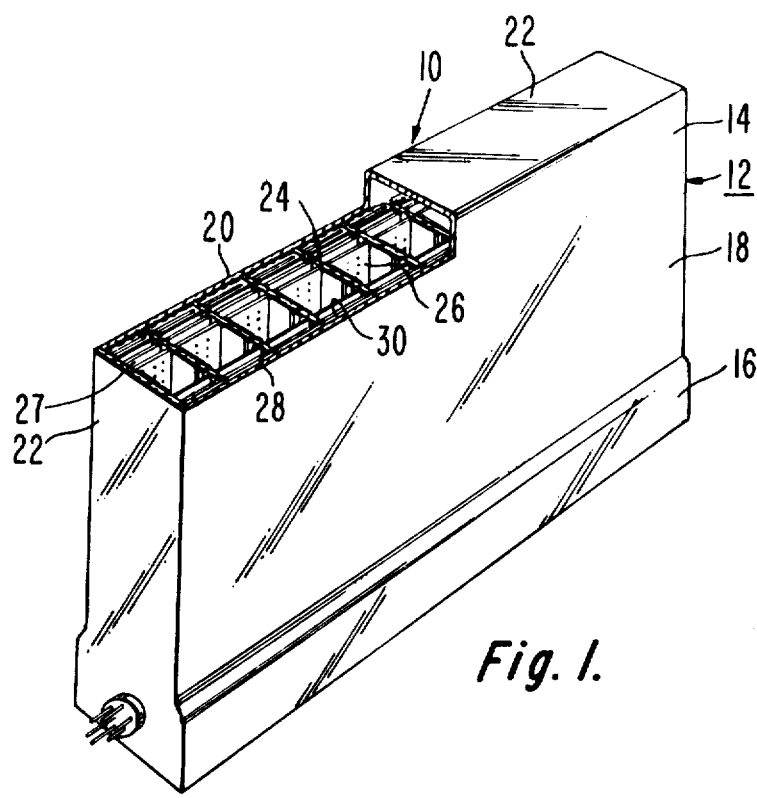
FIG. 1 is a perspective view of an image display device utilizing the present invention.

With initial reference to FIG. 1, a flat panel image display device generally designated as 10 comprises an evacuated envelope 12 having a display section 14 and an electron gun section 16. The display section 14 is formed by front and rear walls 18 and 20, respectively spaced apart by four sidewalls 22. Within the display device envelope 12 are a plurality of support walls 24 extending between the front and rear walls 18 and 20 so as to divide the envelope into a number of channels 26. Within each of the channels 26 is an electron beam guide generally designated as 27 which may take the form of any of several conventional guides such as the one disclosed in U.S. Pat. No. 4,028,582 entitled "Guided Beam Flat Display Device" issued on June 7, 1977 to C. H. Anderson et al. On the interior surface of the front wall 18 is a cathodoluminescent screen 28 and an anode electrode 30.

The gun section 16 is an extension of the display section 14 and extends along one set of adjacent ends of the channels 26. The gun section 16 may be of any shape suitable to enclose the particular gun structure contained therein. The electron gun structure may be of any well known construction suitable for selectively directing beams of electrons along each of the channels 26. For example, the gun structure may comprise a plurality of individual guns mounted at the end of the channels 26. Alternately, the gun structure may include a line cathode extending along the gun section 16 across the ends of the channels 26 and adapted to selectively direct individual beams of electrons into the channels. A gun structure of the line type is described in U.S. Pat. No. 2,858,464, entitled "Cathode Ray Tube" issued on Oct. 28, 1958 to W. L. Roberts.

During the operation of the display device 10, electron beams generated by the electron gun section 16 simultaneously travel up each of the guides 27 in the channels 26. When the beams reach a desired position along the length of the guide, they are deflected out of the guide toward the cathodoluminescent screen 28. The beams in each channel 26 then scan the portion of the screen within that channel so that the electron beams in each of the channels simultaneously scan a section of a horizontal line on an image display device.

Figure 2:
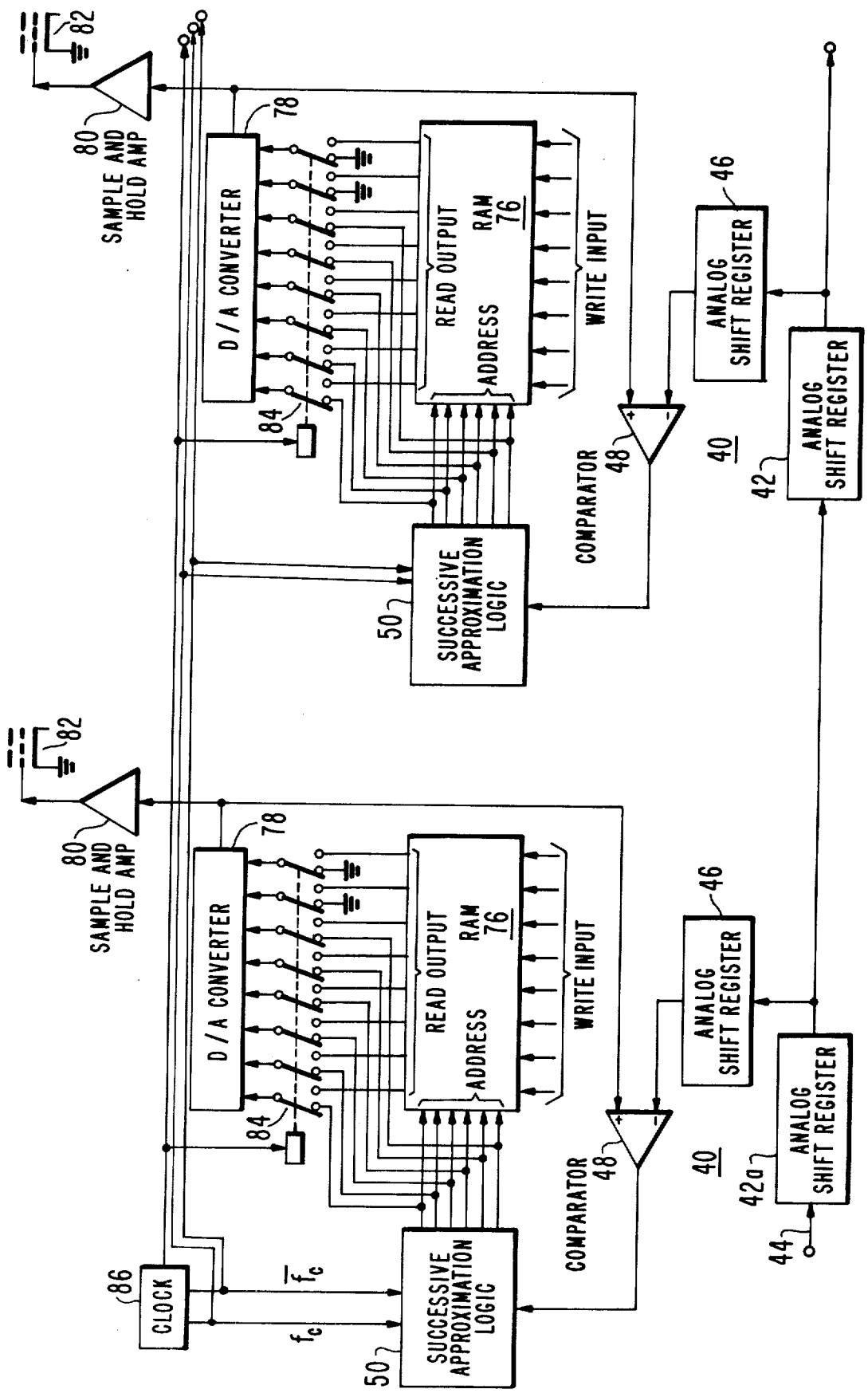
FIG. 2 is a circuit diagram of the present addressing system.

The video signal may be simultaneously supplied to generate the electron beams in each of the channels 26 utilizing a circuit shown in FIG. 2. A separate gun control circuit 40 is used for each channel 26 in a monochrome display (two such circuits are shown in FIG. 2). If the display device 10 is to be used for a color image, there will be three beams generated in each channel 26 and hence three control circuits 40 similar to that shown in FIG. 2 must be associated with each channel.

Each control circuit 40 has a first analog shift register 42 which may be a charge coupled device shift register or alternatively a bucket brigade delay line. The input signal 44 for the first shift register 42 is a conventional serial analog video signal. Each first shift register 42 has a number of stages equal to the number of picture elements in the portion of the display line to be scanned in its associated channel. The first shift registers 42 are connected in series so that the sum of all of the stages in the first shift registers 42 equals the number of picture elements along a given line of the display device. Each control circuit 40 also has a second analog shift register 46 having one stage for each of the picture elements in a line in the associated channel 26. For example, a typical device 10 may have forty channels and approximately 640 picture elements for each color on a given line. Therefore, there would be forty first and second shift registers each having sixteen (640/40) stages. In this case, the electron beam in each module scans 16 color picture elements in each line. The output of the first shift register 42 is connected to the input of the second shift register 46.

A voltage comparator 48 has its inverting input terminal connected to the output terminal of the second shift register 46. The output terminal of the voltage comparator 48 is connected to the analog input terminal of a successive approximation logic unit 50. The successive approximation logic unit 50 generates a digital number which is then incremented or decremented depending upon the signal from the comparator. In the embodiment shown in the drawing, a six bit digital number is generated. However, the present invention is not limited to a specific number of bits. Circuitry for the successive approximation is well known for the digital to analog conversion. An example of the successive approximation circuitry is described in *Electronic Design*, vol. 25, pages 55–57, Dec. 5, 1968 and is shown in FIG. 3 hereof.

Figure 3:
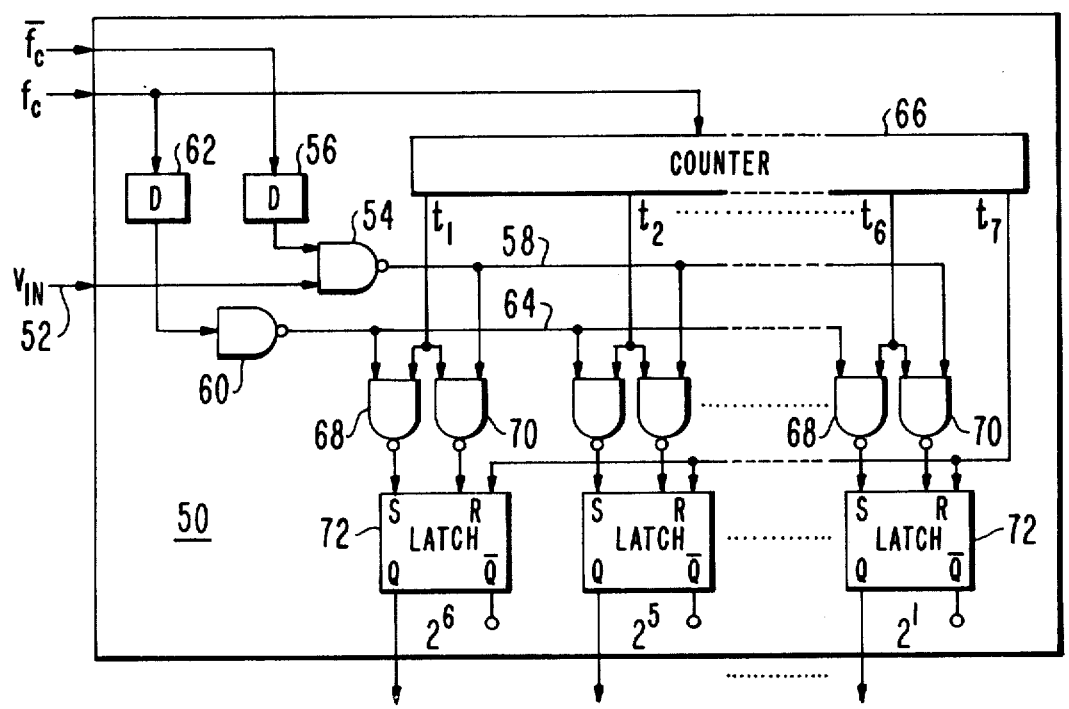
FIG. 3 is a circuit diagram of a component of the circuit in FIG. 2.

Referring to FIG. 3, the output of the comparator 48 designated $V_{in}$, enters the logic unit 50 and is coupled via input line 52 to one input of a two-input first NAND gate 54. The other input terminal of the first NAND gage 54 is coupled to an inverted clock pulse signal, $\bar{f}_c$, which has been differentiated by a first differentiator 56. The output terminal of the first NAND gate 54 is connected to a first bus 58. A second two-input NAND gate 60 functions as an inverter having a single input terminal connected to a noninverted clock frequency $f_c$, which has been differentiated by a second differentiator 62. The output terminal of the second NAND gate 60 is connected to a second bus 64. The noninverted clock frequency $f_c$ is also connected to a counter 66, which may be a conventional ring counter, having an output stage $t_1-t_6$ for each bit of the digital number to be generated by the logic unit 50, plus one control output $t_7$.

Each output stage $t_1-t_6$ has an incrementing and decrementing unit composed of a third and a fourth two-input NAND gate 68 and 70, respectively, and a bistable latch 72. The incrementing and decrementing units for three of the bits are shown in FIG. 3 and are designated $2^1$, $2^5$, and $2^6$ with $2^1$ being the least significant bit and $2^6$ being the most significant bit. The third NAND gate 68 has a first input terminal connected to the second bus 64 and its output terminal connected to the set input terminal of the latch 72. The fourth NAND gate 70 has one input terminal connected to the first bus 58 and its output signal connected to the reset input terminal of the latch 72. The second input terminals for both the third and fourth NAND gates 68 and 70 are connected in common to one output terminal ($t_1-t_6$) of the seven stage counter 66. The output signal bits from the successive approximation logic unit 50 are provided by the true output Q from each of the latches 72. The complimentary output $\bar{Q}$ from each of the latches is terminated within the logic unit 50. The seventh output terminal $t_7$ from the counter 66 is connected to the reset input terminal of each of the latches 72.

With reference to FIG. 2, the digital output signal from the successive approximation logic unit 50 is connected to the address input terminals of a random access memory 76. The random access memory stores the mapping information for the electron gun associated with the module 40. The functioning of the random access memory 76 is described in detail in copending U.S. Patent Application Ser. No. 749,178 entitled "Electron Gun Control System" filed on Dec. 9, 1976 by Frank Marlowe and is incorporated herein by reference. That patent application also describes in detail the storage of data in the memory.

A digital to analog converter 78 has its output signal connected to the inverting input of the comparator 48 and to a sample and hold amplifier 80. The sample and hold amplifier 80 is used to bias the electron gun 82 within the gun section 16. The input terminals of the digital to analog converter 78 are connected to a multiplexing switch circuit 84 which alternately connects the input terminals of the D/A converter to either the output signal from the successive approximation logic 50 or the output signal from the memory 76 in response to a pulse from the clock 86.

During the operation of the display, the incoming video signal is serially shifted through each of the first shift registers 42. After one line scan period (e.g., 63.5μ sec. for NTSC television) a line of video information is stored in the first shift registers. Each first shift register 42 contains the video signal information for the portion of the line within its corresponding channel 26. During the horizontal retrace interval, the video information contained in each of the first shift registers 42 is transferred in parallel to each of the second shift registers 46, so that the second shift registers now contain the video signal information for the portion of the display line within each channel 26.

During the next horizontal line period, another line of video information is shifted through the first shift registers 42 and the parallel segments of the previous line of video information, stored in the second shift registers, is shifted out of the second shift registers 46 and applied to the comparator 48. As the video signal for the first picture element is shifted into the comparator of each module, the clocking signals $f_c$ and $\bar{f}_c$ initiate the successive approximation logic unit 50. This initiation resets each of the bit latches 72 to zero and sets the most significant latch ($2^6$) so that the digital word is 100000. The multiplexer 84 connects the D/A converter 78 to the output signal from the successive approximation logic unit 50 so that the digital word from the logic unit is fed into the D/A converter. The digital word is converted to an analog signal and fed to the comparator 48, where it is compared to the output signal of the second shift register 46. If the result of this comparison indicates that the video signal from the second shift register 46 is less than the analog signal equivalent of the digital word from the successive approximation logic, the logic unit 50 resets the latch 72 on the most significant bit ($2^6$) setting that bit to zero. If, however, the comparator 48 indicates that the video signal from the second shift register 46 is greater than the analog of the digital word from the successive approximation logic 50, latch 72 associated with the most significant bit $2^6$ is not reset. The clocking pulse then causes the successive approximation logic unit 50 to place a 1 in the next most significant bit, $2^5$. The new digital word (110000 or 010000) from the successive approximation logic 50 is then converted to analog by the D/A converter 76 and fed to the comparator 48. If the comparison indicates that the analog of the digital word is larger than the video from the second shift register 46, the successive approximation logic will reset the latch for the second most significant bit $2^5$. If the converse is true, no resetting of the latch for the second most significant bit will occur.

This cycling of incrementing the digital number in the successive approximation logic and comparing it with the picture element's video signal, continues for each of the six bits in the digital word. When the last bit has been compared to the incoming video signal, the digital word from the successive approximation logic is a digital approximation of the incoming analog video signal. At this point, the clocking signals for the display cause the multiplex switch 84 to connect the read output from the RAM to the digital-to-analog converter and cause the RAM to be addressed by the successive approximation logic's digital word. The mapping information contained at that address is fed to the digital analog converter 78, the output of which is then fed to the sample and hold amplifier 80. The sample and hold amplifier 80 then utilizes the incoming signal from the D/A converter 78 to modulate the electron beam of the electron gun 82 associated with it. This analog to digital conversion and addressing of the RAM occurs simultaneously in each module for every channel 26.

After the video signal for the first picture element in each module has addressed the RAM and the RAM's output has been fed to the sample and hold amplifier 80, a signal from the last output stage $t_7$ of the counter 66 resets all of the latches 72 in the module 40. Then the video signal for the second picture element of that module is shifted through the second shift register 46 to the comparator 48 and the successive approximation logic unit is initiated once again. At this point, the video signal for the second picture element is processed through the module in a similar fashion to that of the video signal for the first picture element. When the video signal for the last picture element to be scanned by the module has been applied to the electron gun 82, the next line of video information has been stored in the first shift registers 42. Next, this line of information is shifted to the second shift registers 46 and this entire sequence is repeated for the next line of video information.

By using analog shift registers to process the video signal and then separate A/D converters for each module, slower A/D converters may be used over prior art systems employing one A/D converter ahead of the shift registers. The use of a plurality of slower speed converters results in a cost saving over a circuit using one high speed converter. In addition, the analog shift register need not have high tolerances since their inefficiencies will be compensated for when the RAM is updated in the same manner as the individual gun characteristics are compensated for by the system. The present device also uses a single digital to analog converter for the successive digital approximation of the analog video signal as well as the conversion of the memory output signal for biasing the electron gun. This multiplexing of the D/A converter results in a decrease in the number of converters.

We claim:

1. A system for addressing a digital memory with an analog signal and for converting the digital output of the memory to an analog signal, said system comprising:
   a digital to analog converter;
   a comparator having a first input terminal connected to the output terminal of the digital to analog converter and a second input terminal connected to the analog addressing signal;
   means for generating a digital number in response to the output signal from the comparator, said means having an output terminal for coupling the digital number to the addressing input terminal of the memory; and
   means for alternately switching the input terminal of the digital-to-analog converter to the output terminal of the digital memory and to the output terminal of the means for generating the digital number.

2. The system as in claim 1, further comprising a sample and hold amplifier having its input terminal connected to the output terminal of the digital to analog converter.

3. The system as in claim 1 further comprising a clock for providing timing signals to the means for generating the digital number and the switching means.

4. The system as in claim 1 wherein the means for generating the digital number comprises:
   a first differentiator having its input terminal connected to a first timing signal;
   a first NAND gate having one input terminal connected to the output terminal of the first differentiator and another input terminal connected to the output terminal of the comparator;
   a second differentiator having its input terminal connected to a second timing signal;
   a second NAND gate having an input terminal connected to the output terminal of the second differentiator;
   a counter having its control input terminal connected to the second timing signal; and
   at least one incrementing and decrementing unit comprising, a third NAND gate having one input terminal connected to the output terminal of the second NAND gate and another input terminal connected to one output terminal of the counter, a fourth NAND gate having one input terminal connected to the first NAND gate and another input terminal connected to the one output terminal of the counter, a bistable latch having a set input terminal connected to the output terminal of the third NAND gate and a reset input terminal connected to the fourth NAND gate.

5. The system as in claim 1 further comprising a first analog shift register; and a second analog shift register having an input terminal connected to the output terminal of the first shift register and having an output terminal connected to the second input terminal of the comparator.

6. A system for addressing an analog utilization means with an incoming analog signal comprising:
   means for generating and incrementing a digital signal;
   a digital to analog converter coupled to said generating and incrementing means for converting said digital signal to an analog signal;
   a comparator coupled to said digital to analog converter and to said incoming analog signal for comparing the analog output of said converter to said incoming analog signal and feeding the result thereof to said generating and incrementing means to increment the digital output thereof;
   a digital memory coupled to the output of said generating and incrementing means;
   switching means for alternately coupling the output from said generating and incrementing means and from said memory to said digital to analog converter; and means coupling the output of said digital to analog converter to said analog utilization means.

7. The system as in claim 6 further comprising a clock for providing timing signals to said means for generating and incrementing a digital signal.

8. The system as in claim 6 wherein the means for generating and incrementing a digital signal comprises:
- a first differentiator having its input terminal connected to a first timing signal;
- a first NAND gate having one input terminal connected to the output terminal of the first differentiator and another input terminal connected to the output terminal of the comparator;
- a second differentiator having its input terminal connected to a second timing signal;
- a second NAND gate having an input terminal connected to the output terminal of the second differentiator;
- a counter having its control input terminal connected to the second timing signal; and
- at least one incrementing and decrementing unit comprising, a third NAND gate having one input terminal connected to the output terminal of the second NAND gate and another input terminal connected to one output terminal of the counter, a fourth NAND gate having one input terminal connected to the first NAND gate and the other input terminal connected to the one output terminal of the counter, a bistable latch having a set input terminal connected to the output terminal of the third NAND gate and a reset input terminal connected to the fourth NAND gate.

9. The system as in claim 6 further comprising a sample and hold amplifier having its input terminal connected to the output terminal of the digital-to-analog converter.

* * * * *